United States Patent
Chang et al.

(10) Patent No.: US 10,520,546 B1
(45) Date of Patent: Dec. 31, 2019

(54) AUTOMATIC POWER SUPPLY SYSTEM CAPABLE OF ADJUSTING THE POWER SUPPLY AUTOMATICALLY

(71) Applicants: Inventec (Pudong) Technology Corp., Shanghai (CN); Inventec Corporation, Taipei (TW)

(72) Inventors: Yu-Lin Chang, Taipei (TW); Kai-Yang Tung, Taipei (TW); Mao-Ching Lin, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 16/219,767

(22) Filed: Dec. 13, 2018

(30) Foreign Application Priority Data

Nov. 21, 2018 (CN) .......................... 2018 1 1387992

(51) Int. Cl.
*G01R 31/317* (2006.01)
*G01R 19/25* (2006.01)
*G05F 1/46* (2006.01)
*G06F 1/26* (2006.01)

(52) U.S. Cl.
CPC ....... *G01R 31/31721* (2013.01); *G01R 19/25* (2013.01); *G05F 1/463* (2013.01); *G06F 1/26* (2013.01)

(58) Field of Classification Search
CPC .......... G06F 1/1635; G06F 1/263; G06F 1/26; G01R 31/318597; G01R 31/28; G01R 11/54
USPC .................................. 327/540, 541, 542, 543
See application file for complete search history.

(56) References Cited

U.S. PATENT DOCUMENTS

2012/0218005 A1* 8/2012 Chua-Eoan ............... G06F 1/26
327/107

* cited by examiner

*Primary Examiner* — John W Poos
(74) *Attorney, Agent, or Firm* — Winston Hsu

(57) ABSTRACT

An automatic power supply system is electrically coupled to a component to be tested. The automatic power supply system includes a power array and a controller. The power array includes a plurality of power channels, and provides power supplies through the plurality of power channels. The component to be tested is electrically coupled to a first power channel of the plurality of power channels and receives a power supply through the first power channel. The controller is electrically coupled to the power array, and calculates a power of the power supply received by the component to be tested. The controller adjusts a power specification of the power supply provided through the first power channel according to the power.

7 Claims, 2 Drawing Sheets

AUTOMATIC POWER SUPPLY SYSTEM CAPABLE OF ADJUSTING THE POWER SUPPLY AUTOMATICALLY

BACKGROUND OF THE INVENTION

1. Field of the Invention

The present invention is related to an automatic power supply system, and more particularly, to an automatic power supply system capable of adjusting the power supply automatically.

2. Description of the Prior Art

When the heat dissipation test is performed on the device to be tested, since different components to be tested in the device, such as the processor, the memory and the hard disk, require different power specifications, it is necessary to provide different power supplies through the power supply array to carry out the test.

In general, each channel on the power supply array has its own display indicator that shows the output voltage and output current. In the prior art, the operator must adjust the knob of each channel manually to adjust the output voltage of each channel so that the component to be tested can receive the power required for the test.

Since the power loss will occur during the line transmission, and the digital indicators of the power supply array can be inaccurate, the power actually received by the device under test may be different from the power output from the power supply array. In this case, the operator needs to additionally measure the voltage values and the current values actually received by the component under test, and further adjust the power supply array after calculating the power received by the component under test, so that the component under test may receive the required power. That is, during the testing process, the operator must repeatedly calculate the power and adjust the power supply, which not only lowers the testing efficiency but also requires a lot of manual labor.

SUMMARY OF THE INVENTION

One embodiment of the present invention discloses an automatic power supply system. The automatic power supply system is electrically coupled to a component to be tested, and the automatic power supply system includes a power array and a controller.

The power array includes a plurality of power channels, and provides power supplies through the plurality of power channels. The component to be tested is electrically coupled to a first power channel of the plurality of power channels and receives a power supply through the first power channel. The controller is electrically coupled to the power array. The controller calculates a power of the power supply received by the component to be tested, and adjusts a power specification of the power supply provided through the first power channel according to the power.

Another embodiment of the present invention discloses a method for operating an automatic power supply system. The automatic power supply system includes a power array including a plurality of power channels. A first power channel of the plurality of power channels is electrically coupled to a component to be tested.

The method for operating the automatic power supply system includes providing a power supply through the first power channel to the component to be tested, calculating a power received by the component to be tested, and adjusting a power specification of the power supply provided through the first power channel according to the power.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
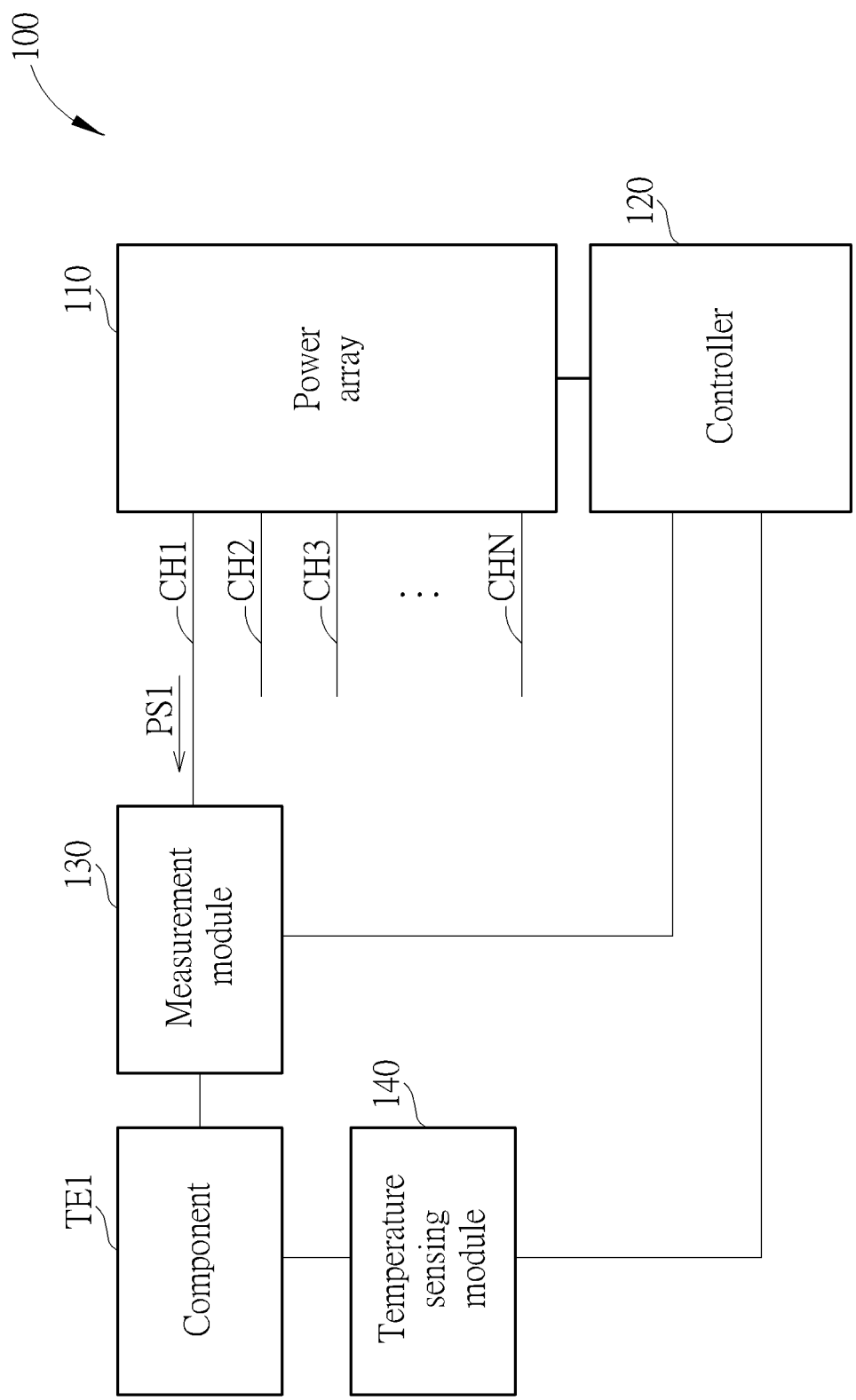
FIG. 1 shows an automatic power supply system according to one embodiment of the present invention.

FIG. 1 shows an automatic power supply system 100 according to one embodiment of the present invention. The automatic power supply system 100 includes a power array 110, and a controller 120 coupled to the power array 110.

The power array 110 includes N power channels CH1 to CHN, where N is a positive integer greater than 1. The power array 110 can provide power supplies through the power channels CH1 to CHN. In FIG. 1, the component TE1 to be tested is electrically coupled to the power channel CH1 of the power channels CH1 to CHN, and receives the power supply PS1 required for the test through the power channel CH1.

For example, the component TE1 may need to be tested with the target power of 10 W. In this case, to ensure that the power array 110 provides the target power required by the test, the controller 120 can calculate the power of the power supply received by the component TE1 and adjust the power specification of the power supply PS1 according to the calculated power. That is, when the controller 120 determines that the power actually received by the component TE1 is smaller than 10 W after calculation, the user can increase the voltage or the current of the power supply PS1 in channel CH1 provided by the power array 110 through the controller 120. On the contrary, when the controller 120 determines that the power actually received by the component TE1 is greater than 10 W after calculation, the user can decrease the voltage or the current of the power supply PS1 in channel CH1 provided by the power array 110 through the controller 120. In some embodiments, the controller 120 can also provide a user interface, which can be displayed by a monitor. Consequently, the user can control the power array 110 directly with the controller 120, thereby simplifying the operation.

In addition, in some embodiments, the controller 120 and the power array 110 can also adjust the power supply to the target power dynamically with the automatic feedback scheme. For example, the controller 120 can calculate the voltage to be output with the mechanism of proportional-integral-derivative (PID) according to the difference between the target power and the actual measured power, and continue to compensate the output voltage according to the feedback until the target power is equal to the actual measured power.

In some embodiments, the controller 120 can read the voltage value and the current value of the power channel CH1 through the power array 110 for calculating the power received by the component TE1. However, in some other embodiments, the automatic power supply system 100 can further include a measurement module 130. The measurement module 130 can be coupled to the controller 120 and the component TE1 to be tested, and can measure the voltage and the current received by the component TE1. For example, the measurement module 130 can include a parallel resistor for measuring the voltage and a serial resistor for measuring the current. That is, the measurement module 130 can measure the actual voltage and the current received by the component TE1. In this way, the error caused by the line transmission or the power supply array 110 can be reduced, allowing the controller 120 to calculate the power received by the component TE1 even more accurately.

In addition, in some embodiments of the present invention, in an initial stage before the power array 110 starts to provide the power supplies, the controller 120 can control the power array 110 to provide an initial voltage, for example but not limited to 5V, through the power channel CH1. In this case, the controller 120 can calculate the effective resistance of the component TE1 according to the initial voltage and the current flowing through the component TE1. Consequently, the controller 120 can determine the initial power specification of the power supply PS1 according to the effective resistance and the target power. That is, the controller 120 can set up the initial power specification of the power supply PS1 according to the effective resistance of the component TE1; therefore, the power supply PS1 can be provided with a more accurate specification initially to reach the target power, shortening the following adjustment time.

In FIG. 1, the automatic power supply system 100 can further include a temperature sensing module 140. The temperature sensing module 140 can be electrically coupled to the controller 120 and the component TE1 to be tested. The temperature sensing module 140 can measure the temperature of the component TE1. In some other embodiments, instead of being electrically coupled to the controller 120 directly, the temperature sensing module 140 can be electrically coupled to the power array 110 through the temperature channel, and the controller 120 can read the measured temperature from the temperature sensing module 140 through the power array 110. In this case, the controller 120 can control the power array 110 to stop providing the power supply PS1 when the temperature of the component TE1 is beyond a predetermined scope. Consequently, the automatic power supply system 100 can provide the over temperature protection for the component TE1 so as to prevent the component TE1 from being damaged by operation at an excessive temperature.

Furthermore, in some embodiments, the component TE1 can be one of the components in the device to be tested. For example, the component TE1 can be the memory in the device to be tested. In this case, to ensure that the device to be tested can function normally for testing, the power array 110 can further provide power supplies of different power specifications for other components in the device, such as the processor, and hard drive. Since the power specifications required by different components may be different, the power array 110 can provide the corresponding power supplies through different power channels, for example, the power array 110 can provide power supplies through power channels CH2 and CH3 for the processor and the hard drive. In this case, the controller 120 can adopt the aforementioned approaches to control the power array 110 to ensure that all components can receive the corresponding target power.

Figure 2:
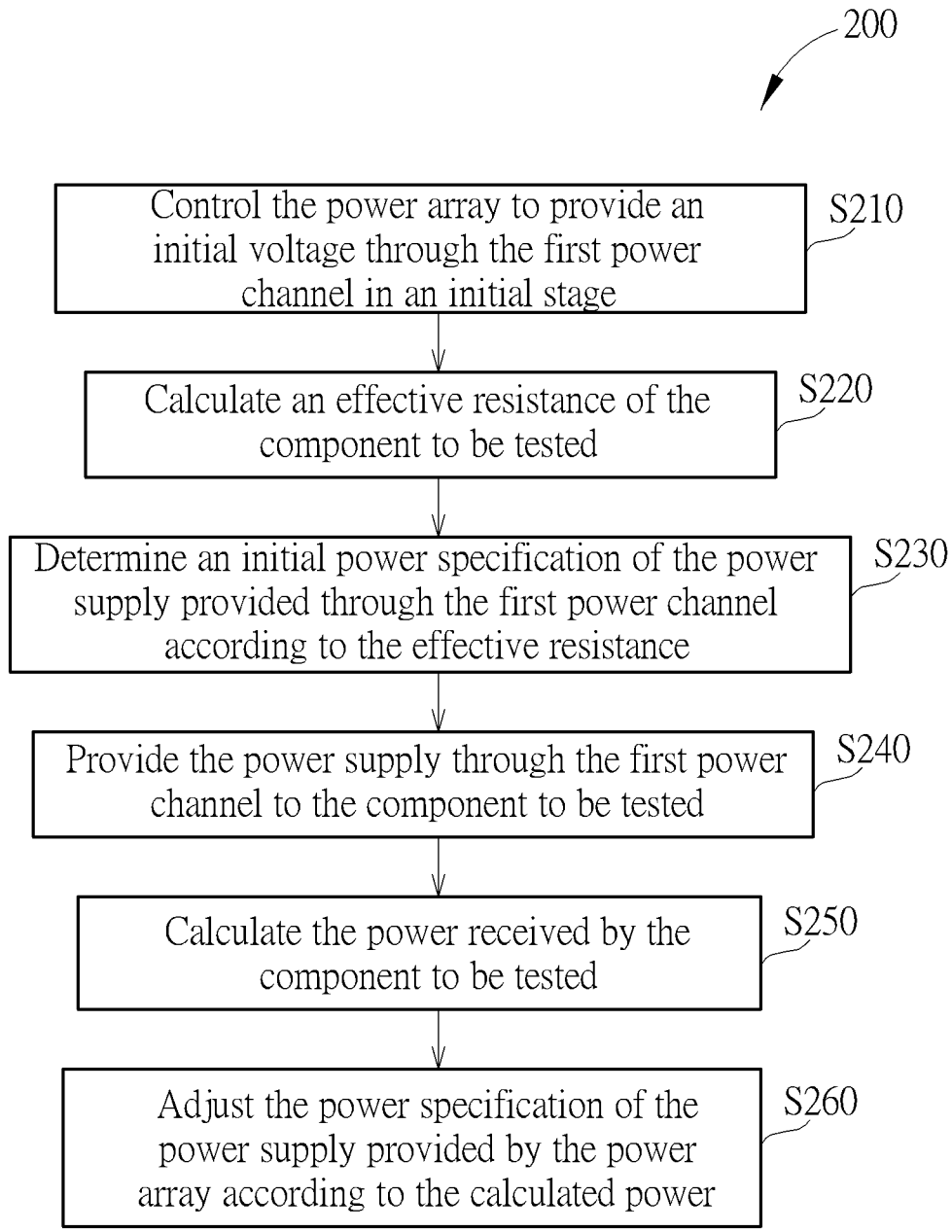
FIG. 2 shows a method for operating the automatic power supply system in FIG. 1 according to one embodiment of the present invention.

FIG. 2 shows a method 200 for operating the automatic power supply system 100 according to one embodiment of the present invention. The method 200 includes steps S210 to S260.

S210: control the power array 110 to provide an initial voltage through the power channel CH1 in an initial stage;

S220: calculate an effective resistance of the component TE1 to be tested;

S230: determine an initial power specification of the power supply PS1 provided through the power channel CH1 according to the effective resistance;

S240: provide the power supply through the power channel CH1 to the component TE1;

S250: calculate the power received by the component TE1;

S260: adjust the power specification of the power supply PS1 provided by the power array 110 according to the calculated power.

In some embodiments, the automatic power supply system 100 can perform the calculations and controls required in steps S210 to S230 with the controller 120. For example, in step S210, the controller 120 can control the power array 110 to provide the initial voltage, for example but not limited to 5V, through the power channel CH1 in the initial stage. Later in step S220, the controller 120 can calculate the effective resistance of the component TE1 to be tested according to the initial voltage and the current flowing through the component TE1. Consequently, the controller 120 can determine the initial power specification of the power supply PS1 according to the effective resistance of the component TE1 and the target power. Since the controller 120 can set up the initial power specification of the power supply PS1 according to the effective resistance of the component TE1, the power supply PS1 can be provided with a more accurate specification initially to reach the target power, shortening the following adjustment time.

After the initial power specification has been determined, the power array 110 can provide the power supply PS1 to the component TE1 to be tested through the power channel CH1 in step S240. Next, in step S250, the power received by the component TE1 can be calculated, and the power specification of the power supply PS1 provided by the power array 110 can be adjusted in step S260 according to the actual power received by the component TE1.

In some embodiments, step S250 can be performed with the controller 120. For example, the controller 120 can read the voltage value and the current value of the power channel CH1 through the power array 110, and calculate the power received by the component TE1 according to the voltage value and the current value read from the power array 110. However, the present invention is not limited to reading the voltage value and current value through the power array 110. In some other embodiments, the measurement module 130 can be used to measure the voltage and the current received by the component TE1, and the controller 120 can calculate the power received by the component TE1 according to the voltage and the current measured by the measurement module 130 in step S250. In some embodiments, by measuring the voltage and current with the measurement module 130, the error caused by line transmission or the power array 110 can be reduced, allowing the controller 120 to calculate the power received by the component TE1 even more accurately.

Since the actual power received by the component TE1 can be derived in step S250, the power specification of the power supply PS1 provided by the power array 110 can be further adjusted according to the power in step S260 so that the component TE1 can be operated with the target power required for testing.

For example, if the component TE1 needs to be tested with the target power of 10 W while the controller 120 determines that the power actually received by the component TE1 is smaller than 10 W after calculation in step S250, the controller 120 can increase the voltage or the current of the power supply PS1 in channel CH1 provided by the power array 110 in step S260. On the contrary, when the controller 120 determines that the power actually received by the component TE1 is greater than 10 W after calculation, the controller 120 can decrease the voltage or the current of the power supply PS1 in channel CH1 provided by the power array 110. In some embodiments, the controller 120 can also provide a user interface, which can be displayed by a monitor. Consequently, the user can control the power array 110 directly with the controller 120 in step S260, thereby simplifying the operation.

In addition, in some embodiments, in step S260, the controller 120 and the power array 110 can also adjust the power supply to the target power dynamically with the automatic feedback scheme. For example, the controller 120 can calculate the voltage to be output with the mechanism of proportional-integral-derivative (PID) according to the difference between the target power and the actual measured power, and continue to compensate the output voltage according to the feedback until the target power is equal to the actual measured power.

In addition, in some embodiments, the method 200 can further measure the temperature of the component TE1 with the temperature sensing module 140, and the controller 120 can control the power array 110 to stop providing the power supply PS1 when the temperature of the component TE1 is beyond a predetermined scope, preventing the component TE1 from being damaged by operation at an excessive temperature.

In summary, the automatic power supply systems and the methods for operating the automatic power supply systems provided by the embodiments of the present invention can calculate the power received by the component to be tested with the controller, and adjust the power supply of the power array according the calculated power. Therefore, the efficiency of testing can be improved and the cost of manual labor and time can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An automatic power supply system electrically coupled to a component to be tested, the automatic power supply system comprising:
   a power array comprising a plurality of power channels, and configured to provide power supplies through the plurality of power channels, wherein the component to be tested is electrically coupled to a first power channel of the plurality of power channels and receives a power supply through the first power channel; and
   a controller electrically coupled to the power array, and configured to calculate a power of the power supply received by the component to be tested and adjust a power specification of the power supply provided through the first power channel according to the power;
   wherein the controller reads a voltage value and a current value of the first power channel through the power array, and calculates the power of the power supply received by the component to be tested according to the voltage value and the current value.

2. The automatic power supply system of claim 1, wherein the controller is further configured to control the power array to provide an initial voltage through the first power channel in an initial stage, calculate an effective resistance of the component to be tested, and determine an initial power specification of the power supply provided through the first power channel according to the effective resistance.

3. An automatic power supply system electrically coupled to a component to be tested, the automatic power supply system comprising:
   a power array comprising a plurality of power channels, and configured to provide power supplies through the plurality of power channels, wherein the component to be tested is electrically coupled to a first power channel of the plurality of power channels and receives a power supply through the first power channel;
   a controller electrically coupled to the power array, and configured to calculate a power of the power supply received by the component to be tested and adjust a power specification of the power supply provided through the first power channel according to the power; and
   a measurement module electrically coupled to the controller and the component to be tested, and configured to measure a voltage and a current received by the component to be tested, wherein the controller calculates the power of the power supply received by the component to be tested according the voltage and the current measured by the measurement module.

4. The automatic power supply system of claim 3, further comprising a temperature sensing module electrically coupled to the controller and the component to be tested, and configured to measure a temperature of the component to be tested, wherein the controller is further configured to stop providing the power supply through the first power channel when the temperature of the component to be tested is beyond a predetermined scope.

5. A method for operating an automatic power supply system, the automatic power supply system comprising a power array comprising a plurality of power channels, and a first power channel of the plurality of power channels is electrically coupled to a component to be tested, the method for operating the automatic power supply system comprising:
   providing a power supply through the first power channel to the component to be tested;
   reading a voltage value and a current value of the first power channel through the power array;
   calculating a power of the power supply received by the component to be tested according to the voltage value and the current value; and
   adjusting a power specification of the power supply provided through the first power channel according to the power.

6. The method for operating the automatic power supply system of claim 5, further comprising:
   controlling the power array to provide an initial voltage through the first power channel in an initial stage;
   calculating an effective resistance of the component to be tested; and determining an initial power specification of the power supply provided through the first power channel according to the effective resistance.

7. The method for operating the automatic power supply system of claim 5, further comprising:

measuring a temperature of the component to be tested; and stopping providing the power supply through the first power channel when the temperature of the component to be tested is beyond a predetermined scope.

\* \* \* \* \*